United States Patent
Walpita

(10) Patent No.: US 6,236,061 B1
(45) Date of Patent: May 22, 2001

(54) SEMICONDUCTOR CRYSTALLIZATION ON COMPOSITE POLYMER SUBSTRATES

(76) Inventor: Lakshaman Mahinda Walpita, 67 Huntington Rd., Basking Ridge, NJ (US) 07920

( * ) Notice: Subject to any disclaimer, the term of this patent is extended or adjusted under 35 U.S.C. 154(b) by 0 days.

(21) Appl. No.: 09/227,467

(22) Filed: Jan. 8, 1999

(51) Int. Cl.[7] ............................. H01L 29/78; H01L 33/00
(52) U.S. Cl. ............................................. 257/40; 257/347
(58) Field of Search ........................................ 257/40, 347

(56) References Cited

U.S. PATENT DOCUMENTS

| | | | |
|---|---|---|---|
| 4,059,461 | * | 11/1977 | Fan et al. . |
| 4,309,225 | * | 1/1982 | Fan et al. . |
| 4,400,715 | * | 8/1983 | Barbee et al. . |
| 4,719,183 | * | 1/1988 | Maekawa . |
| 4,751,193 | * | 6/1988 | Myrick . |
| 5,538,564 | * | 7/1996 | Kaschmitter . |
| 5,552,210 | * | 9/1996 | Horn, III et al. . |
| 5,739,193 | * | 4/1998 | Walpita et al. . |

* cited by examiner

*Primary Examiner*—Stephen D. Meier
(74) *Attorney, Agent, or Firm*—William L. Botjer

(57) ABSTRACT

A structure and methodology for providing electronic devices comprised of semiconductor materials deposited and crystallized using a pulsed laser source on oxide and/or metal layers on polymeric and polymer composite substrates of low coefficient of thermal expansion (CTE). The present invention permits the fabrication of inexpensive yet highly efficient electronic devices, such as photovoltaic cells, on the filled substrates by the use of laser annealing techniques.

17 Claims, 3 Drawing Sheets

120# SEMICONDUCTOR CRYSTALLIZATION ON COMPOSITE POLYMER SUBSTRATES

FIELD OF THE INVENTION

This invention relates generally to semiconductor materials deposited and crystallized using a pulsed laser source on oxide and/or metal layers on polymeric and polymer composite substrates of low coefficient of thermal expansion (CTE). Applications related to such an invention are also addressed.

BACKGROUND OF THE INVENTION

New technology to fabricate semiconductor films on polymer substrates are needed in electronic industry for many applications. Semiconductor materials are particularly useful, if they can be crystallized with good structural integrity on polymer substrates so that the films can be used to function in electronic circuits, light detectors, light emitting diodes (LED), thin film transistors (TFT), CMOS and SRAMS. These have a variety of end uses as for example solar cells, display devices and electronic circuits.

One approach to making crystallized semiconductor films on any substrate is to deposit the semiconductor film on the substrate and anneal the semiconductor film using a pulsed laser source. Many have used laser annealing to achieve low temperature processing in making thin film transistors on glass substrates. See for example Kyung Ha Lee et al., IEEE Electron Device Lett. 17, 258 (1996). On polymer substrates this approach is difficult because the laser can heat the polymer substrate and damage both the polymer/semiconductor interface and the semiconductor film even when thermally insulating layers are introduced in between the polymer substrate and the semiconductor film. The polymer substrate must also be stable to changes in ambient moisture (humidity) and temperature. Resistance to elevated temperatures, as well as high mechanical strength, impact resistance and chemical resistance are also all desirable.

Various prior techniques for improving the crystallinity of semiconductor films by laser annealing and doping the films are exemplified by U.S. Pat. No. 4,059,461 issued Nov. 22, 1977 to J. C. C. Fan et al.; U.S. Pat. No. 4,309,225 issued Jan. 5, 1982 to J. C. C. Fan et al.; U.S. Pat. No. 4,400,715 issued Aug. 23, 1983 to S. G. Barbes et al.; U.S. Pat. No. 4,719,183 issued Jan. 12, 1988 to M. Maekawa; U.S. Pat. No. 4,751,193 issued Jun. 14, 1988 to J. J. Myrick, U.S. Pat. Nos. 5,346,850 issued Sep. 13, 1994 and 5,538,564 issued Jul. 23, 1996 to J. L. Kaschmitter et al. Various prior techniques for reducing the polymer substrate CTE are exemplified by U.S. Pat. No. 5,552,210 issued Sep. 1996 to Horn et al.; and U.S. Pat No. 5,739,193 issued Apr. 14, 1998 to Walpita et al.

In these prior developments and research efforts laser annealing have been done to improve crystallinity of crystalline or amorphous semiconductors, particularly silicon, deposited on insulator films on substrates such as PET, PES, PTFE at a range of processing temperatures from room temperature to 180° C. Semiconductor films deposited and laser annealed on deposited films of metal and oxide on these plastics does not retain film integrity under temperature cycling and during use over short and long time periods because large mismatch of the coefficient of thermal expansion (CTE) between the deposited films and the plastic substrates in the operating temperature ranges. Therefore the laser annealing technologies can not be effectively utilized for plastic substrates in practical applications.

The present invention permits the fabrication of inexpensive yet highly efficient electronic devices, such as photovoltaic cells, on the filled substrates by the use of laser annealing techniques.

SUMMARY OF THE INVENTION

The present invention overcomes the problem of CTE mismatch by reducing the difference in CTE of the deposited film and the substrate by introducing filler into the substrate. A filled polymeric substrate which has a low CTE is made by mixing a polymer of high thermal coefficient of expansion and fillers of low thermal coefficient of expansion and molding them into articles at above polymer melt temperature. One way of making such a substrate is melt extruding the mixed composition into strands and cutting the strands into pellets. Pellets so made are fed into a molding machine to form films, sheets or other shapes. The mixed composition can also be compressed molded or extruded into films, sheets or other shapes. One or two layers of thermally or electrically insulating or non insulating layers are deposited onto the surface of films, sheets and/or other shapes by standard vacuum techniques or laminated by thermal compression or during molding processes. Layers of semiconductors are further deposited onto the deposited layers by standard vacuum techniques and laser annealed selectively. Layers of oxide and/or metal are further deposited on to the semiconductor layers by standard vacuum techniques. All insulating, non-insulating, and semiconductor layers can be patterned before or after laser annealing.

It is the object of the present invention to provide a method or a process of fabricating crystallized semiconductor film on a metal and/or oxide film on a polymer substrate which will retain film integrity without cracks.

It is another object of the invention to provide examples of devices; such as solar cells and light emitting diodes

BRIEF DESCRIPTION OF THE DRAWINGS

For a better understanding of the invention, reference is made to the following drawings which are to be taken in conjunction with the detailed description to follow in which.

The layer thicknesses in the figures are for illustration only and not drawn to scale.

DETAILED DESCRIPTION OF THE INVENTION

When semiconductor films such as silicon are deposited and laser annealed (CTE<5 ppm/° C.) on an oxide film on an unfilled polymer (CTE>40 ppm/° C.), because of the large thermal coefficient mismatch between the substrate and films, the films show cracks during temperature cycling in the operating temperature ranges. It was discovered that polymer composite substrates when reduced in CTE to a value below 40 ppm/C., makes it more suitable for deposition of oxides and/or metal of thickness less than 4 microns and further deposition and laser annealing of semiconductor materials such as silicon, GaAs, InP, InGaAsP because there is less mismatch in CTE between polymer composition and the deposited and laser annealed films. The reduction in CTE of the substrate leads to good film integrity without cracking in the operating temperature ranges of the substrate. The combination of a polymer and a large amount of filler gives the filled polymer substrate a low thermal coefficient of expansion (CTE) compared to the unfilled polymer. It was surprising that a silicon film of low CTE could show good film integrity without cracks when deposited on an oxide film on filled polymer substrates (e.g. substrate CTE approximately 30 ppm/° C.) with very much higher CTE than silicon. When the substrate CTE is reduced, film integrity can be retained even when the film on which the semiconductor is deposited is more thermally conductive than insulating films such as silicon dioxide. The electrical properties of semiconductor films on reduced CTE polymer substrates are also better than those on unfilled polymer substrates or films; electron mobility in the silicon films can be 10 times greater on filled polymer compared to those on unfilled polymer. On laminated metal films (e.g. copper films) of thickness greater than 5 microns, preferably greater than 10 microns the silicon film integrity can retain without cracks for metal films of CTE less than 20 ppm/° C.

Figure 1:
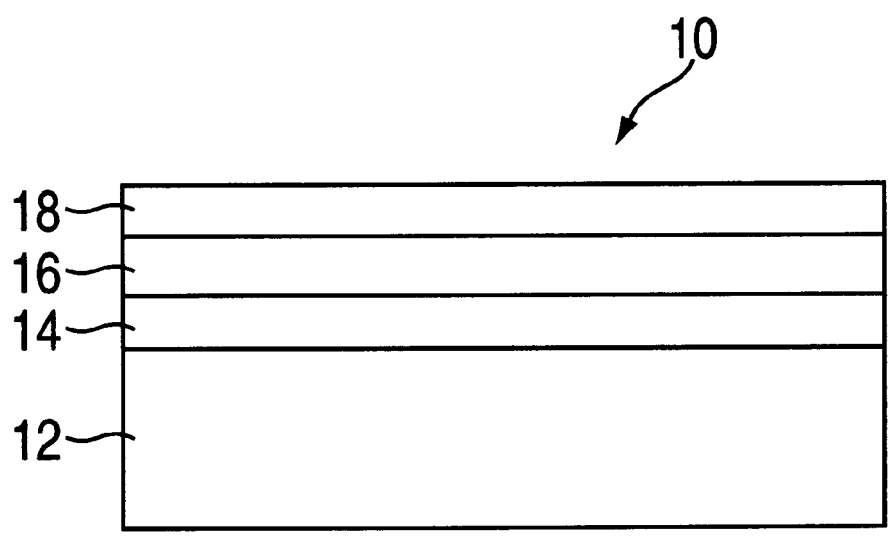
FIG. 1 is a sectional view of an electronic device in accordance with the present invention.

FIG. 1 illustrates a device 10 having a filled polymer substrate 12, an electrode and/or separation layer(s) 14, semiconductor layer(s) 16, which will be laser annealed and a second electrode and/or separation layer 18.

The choice of a polymer for the filled substrate 12 depends on the properties that are desired in applications (e.g. thermal properties, mechanical properties, electrical properties). Polymers of low loss tangent are desirable in high frequency applications. Polymers of high dielectric strength are desirable in high power applications. The polymers that are used can be thermosets, semi-crystalline, amorphous, or liquid crystalline. A partial list of suitable polymers that may be used for substrate to deposit and laser anneal semiconductor materials on deposited films follows: polyethylene, ultra-high molecular weight polyethylene, polystyrene, syndiotecticpolystyrene, poly(oxymethylene), polycarbonate, poly (phenyleneoxide), poly(etherimide), poly(sulfone), poly (ethersulfone), nylon 6, nylon 66, poly (ethylene terephthalate), pol(1,4-cyclohexanedimethylene terephthalate), poly (ethylene naphthalate), polyaralenesulfide, poly (phenylene sulfide), poly (amide imide), poly aralenetherketone, polyetheretherketone, poly (etherketone), cycloolefine copolymer, thermoplastic liquid crystalline polymers, fluoropolymer, thermosets, polyphenylene sulphone, and mixtures thereof.

The choice of a filler for substrate 12 to be used depends on the properties that are desired by application (e.g. thermal properties, mechanical properties, electrical properties). Particulate fillers in general will improve the Heat Distortion Temperature (HDT) of the polymer composite. Fillers of high thermal conductivity can improve the thermal conductivity of the composites. Several fillers can be combined to improve the temperature stability of the dielectric constant of the polymer composite.

The fillers that may be included in this invention are well known in the art. They are as follows: carbon, wollastonite, mica, talc, silicates, silica, clay, alumina, glass (including hollow glass spheres), aerogels, rock wool, silicon carbide, diamond, fused quartz, aluminum nitride, beryllium oxide, boron nitride, and magnesium titanate, all in either particle, platelet or fiber form, including a mixture of more than one filler. In addition they may include various ceramics as follows: strontium titanate, calcium titanate, barium neodymium titanate, barium strontium titanate/magnesium zirconate, titanium oxide, barium titanate, barium magnesium titanate, lead zirconium titanate, barium zirconate, calcium zirconate, spinel, and thoria, all in either particle, platelet or fiber form, including a mixture of more than one filler. The percent of filler may range from 25–90% by volume of the finished substrate depending on the requirements of the application. Such filler percentages can reduce the CTE of the substrate to less than 40 ppm/° C., preferably less than 30 ppm/° C., and more preferably less than 20 ppm/° C. and even more preferably less than 10 ppm/° C.

Methods of making substrate films, sheets, or other shapes based on composite materials are well known in the art and done by first melt mixing one or more filler materials at the desired polymer melt temperature. Then the melt is extruded into strands and cut into pellets. The pellets are injection molded or compress molded to generate composite sheets. Another way of making films, sheets, or other shapes is by physically mixing the polymer and the filler and compression molding the articles. Various other ways of making various shapes will be apparent to those skill in the art of polymer processing.

Separation layers 14 can be formed from one or more oxide and/or metal layers which are deposited on substrate 12 prior to the deposition of semiconductor layers 16. Layers 14 and 18 can be oxides or metals and electrically and/or thermally conductive or non-conductive. One or two sets of layers defined as oxides (a) and metals (b) of thermally and electrically conducting and non conducting materials can be deposited by vacuum techniques. A partial list of some of the materials that may be used as deposited layer 14 follows: (a) silicon dioxide, alumina, titanium oxide, tin oxide, indium tin oxide, indium oxide, tungsten oxide, magnesium oxide, niobium oxide, zirconium oxide, and a mixture of more than one layer, (b) aluminum, titanium, copper, tantalum, chromium, cobalt, aluminum/copper, and a mixture of more than one. The layers forming layer 14 may be arranged either oxide first or metal first (total thickness may be 1–5 microns) or layer 14 can be a single layer of oxide or metal alone.

In device 10 the semiconductor layers 16 may be intrinsic (i) and/or n-type and/or p-type. It is known that phosphorous doping of intrinsic silicon will lead to n-type silicon and boron doping into intrinsic silicon will lead to p-type silicon. For other types of semiconductors depending on the application other types of dopants known in the art can be used. A partial list of semiconductor layers that can be deposited on to the deposited thermally and electrically conducting and non conducting layers follows: Si, Ge, SiGe, SiC, GaAs, InGaAs, InGaAsP, GaN and the like. Examples of Donor and Acceptor dopants include Sb, P, Bi, B, Al, Zn, Mn, Si, As. The semiconductor layers (doped and undoped) can be deposited in a mixture of layers to form n, p, p-n, n-p, p-i-n, n-i-p type polarities. The structure of separation/electrode layer 14, 18 and semiconductor layers 16 can be deposited atop each other to provide a "stacked" structure.

Separation/electrode layers 14, 18 and semiconductor layers 16 can be deposited by several vacuum techniques, namely, electron beam (e-beam) evaporation, sputtering, chemical vapor deposition (CVD), physical vapor deposition (PVD) etc. Most of these processes can be modified by ion assisted or plasma enhanced deposition. E-beam, CVD and PVD been have shown much promise in good quality low cost film deposition. The selected semiconductor layers 16 deposited on separation/electrode layers 14 were subjected to laser annealing at high laser energ >250 mJ/cm$^2$ of pulse width 20–40 nsec. and frequency >5 Hz and at temperatures 25 to 200° C. One or more layers in a given semiconductor structure can be laser annealed depending on the application. Laser annealing crystalizes the semiconductor material and improves electron mobility and thus lowers sheet resistance. P, N and intrinsic layers can be annealed, with the annealing of the intrinsic layers being particularly effective for solar cells. Furthermore, when constructing LED's anodic etching of the semiconductor layers in for example in an electrolyte mixture containing hydrofluoric acid, water and ethanol will provide band structure adjustment The invention is further illustrated by the following non-limiting examples using poly(phenylene sulfide) and poly (etherether ketone) as the polymer for the substrate material but substrates suitable for deposition and laser annealing of semiconductor materials that will keep semiconductor film integrity can be made with other polymers with suitable filler. Various other structural, processing techniques and laser annealing sequences will be apparent to those skill in the semiconductor device technology and polymer processing.

EXAMPLE 1

A series of two compositions of poly(phenylene sulfide), strontium titanate, and mica with proportions: (a) 50 volume % poly(phenylene sulfide)(PPS)/25 volume % strontium titanate/25 volume % mica; (b) 62 volume %poly(phenylene sulfide)(PPS)/ 14 volume % strontium titanate/24 volume % mica. Poly(phenylene sulfide), trade name FORTRON® W205 was obtained from Hoechst Celanese corporation, Bridgewater, N.J. and was compounded and extruded into strands in a BARTSTORF™ or BRABENDER twin screw extruder with strontium titanate (average particle size ranging from 1 to about 2 microns ) purchased from Tam Ceramics Inc., 4511 Hyde Park Boulevard, Niagra Falls, N.Y. 14305 and with mica obtained from KMG minerals. Inc., Kings Mountain, N.C., 28086 and designated L-140. The mica was in the form of platelets having an average particle size of about 70 microns. The processing temperature ranged from 310° C. to 260° C. The compounded product was extruded into water and pelletized.

The pelletized compounds were then made into plaques (6 inch×6 inch×⅛ inch ) by injection molding in DEMAG injection molding machine at temperature about 300° C. The plaques were cut into several 2.5 inch×2.25 inch substrates and further compressed (at temperature 290–300° C. and pressure range 350 to 1000 psi) in a static vacuum press to improve the smoothness of the surface. These surfaces may be oxidized by known PPS oxidation techniques.

EXAMPLE 2

In this example polymer powder and strontium titanate was physically mixed. The composition consisted of 40 weight % poly (etherether ketone) (PEEK)/60 weight % strontium titanate. The mixture was compress molded in 2.5 inch×2.25 inch mold at temperature 345–350° C. and pressure 1250 psi in a static vacuum press. The composite plaques were approximately 75 mil thick.

EXAMPLE 3

A molded sheet of composite containing 62% by volume of poly(phenylene sulfide), 14% by volume strontium titanate and 24% by volume of mica described previously is laminated to a layer of JTC Grade 3 copper foil (1 ounce or half ounce) from Gould Inc. using known lamination techniques, i.e. by thermal compression of copper on the composite substrates, during molding, and during composite sheet extrusion. These sheets are further cut into 2.5inch×2.5 inch substrates.

EXAMPLE 4

The polymer composite substrates in examples 1, 2, and 3 were cleaned using known solution cleaning and vacuum techniques. Ion assisted e-beam evaporation was used to deposit all film layers on the polymer substrates. Oxide layers and semiconductor materials on to the cleaned polymer substrates were deposited under the vacuum in the range $10^{-5}$ to $10^{-3}$ torr., ion beam energy in the range 40 to 110 ev and substrate temperature in the range 25° C. to 200° C. The total film thickness of greater than 4 microns can be deposited with good film quality without cracks

EXAMPLE 5

Layers of oxides, doped silicon and undoped silicon were deposited on to the PPS composites substrates by process described in example 4. The composite substrates consist of: (a) 50% volume % polyphenylene sulfide(PPS)/25% volume % SrTiO3/25 volume % Mica. The coefficient of thermal expansion (CTE) in the plane of the substrate was approximately 25 ppm/° C. The polymer substrates showed good mechanical and electrical properties, including: acceptable toughness and low moisture absorption (<0.05 wt %).

Figure 2:
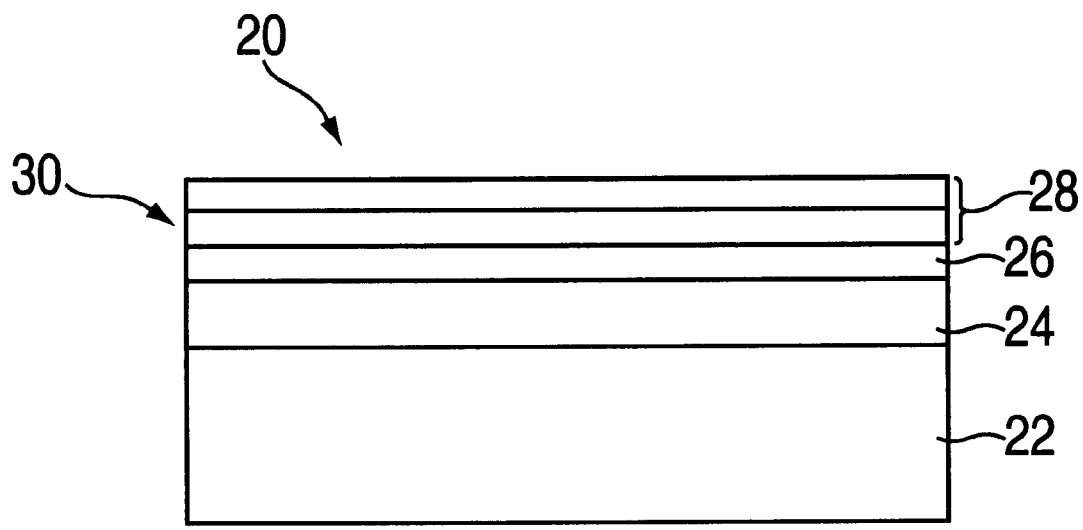
FIG. 2 is a sectional view of a device constructed in accordance with example 5 of the present invention.

For mobility studies, FIG. 2 illustrates a layered structure 20 including the substrate 22 described above, an indium tin oxide film 24 of thickness 2.5 microns, silicon dioxide 26 of a thickness of 0.4 microns, and a silicon film 28 of 0.2 micron N-type doped $10^{17}$ were deposited on a polymer substrate. The amorphous silicon deposited on the oxide/ polymer substrate was laser annealed (shown as reference number 30) in a vacuum ($1 \times 10^{-3}$ torr.) at room temperature (25° C.), by excimer laser (308 nm) of beam size 5 mm×6 mm, in the energy range 200 to 385 mJ/cm$^2$. The silicon was annealed as shown by reference number 30 to a depth of greater than 0.04 microns without damage to the polymer substrate in this energy range.

X-ray diffraction analysis revealed that the annealing of silicon at pulse energy >300 mJ/cm$^2$ of pulse duration 20 to 40 nsec. and >5 Hz frequency, leads to complete crystallization of silicon in a thickness greater than 0.04 microns with >16 pulses at >5 Hz frequency. Silicon layers 28 (0.2 micron) on silicon dioxide layer 26 were evaluated for sheet resistance and electron mobility. At laser energy 300 mJ/cm$^2$ and 5 Hz frequency, the sheet resistance reduces (see table i herein) with increasing number of laser pulses; at 64 pulses a sheet resistance as low as 28 ohms/sq compared to 50 ohms/sq (no annealing) is observed. The sheet resistance and electron mobility corresponding to 16 pulses were 37.4 ohms/sq and 92.4 cm$^2$/V.S respectively. The low CTE polymer composite substrates showed improved electrical properties

EXAMPLE 6

Figure 3:
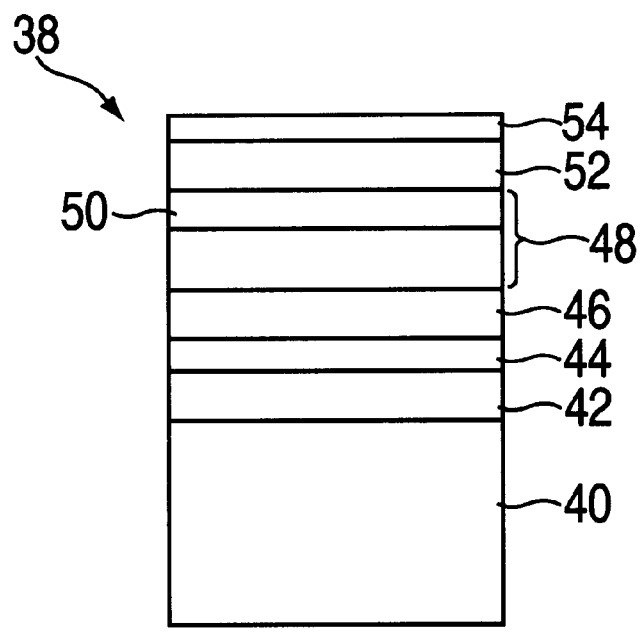
FIG. 3 is a sectional view of a device constructed in accordance with example 6 of the present invention.

As shown in FIG. 3, a photovoltaic (solar) cell 38 comprising layers of conductive materials, highly doped silicon and lightly doped silicon were deposited on to a PPS composite substrate 40 by process described in example 4. The composites consist of: (a) 50% volume % polyphenylene sulfide(PPS)/25% volume % SrTiO3/25 volume % mica. The coefficient of thermal expansion (CTE) in the plane of the substrate was approximately 25 ppm/° C. The polymer substrates showed good mechanical and electrical properties, including: acceptable toughness and low moisture absorption (<0.05 wt %).

For solar cell applications, an electrically conductive film (metal or conductive oxide) is needed as one electrode. A layered structure consisting of an electrically and thermally conducting indium tin oxide layer 42 and a layer of titanium film 44 of total thickness less than 4 microns and a selectively doped silicon layered films. The layered semiconductor (silicon) structure consists of a layer of N-type silicon 46 (doped $10^{17}/cm^3$ and 0.1 micron), a slightly P doped layer 48 ($10^{14}/cm^3$ and 0.7 micron thickness).

In the solar cell structure described, after deposition of slightly doped p-type silicon layer 48, the surface thereof is annealed, as shown by reference number 50, by laser at energy 300 mJ/cm² and 5 Hz at 8–96 pulses. Thereafter a layer of P-type silicon 52 (p-type doping $10^{18}/cm^3$ and 0.05 microns) and a titanium film conductive layer 54 are deposited (0.03 microns).

A test unit was constructed to measure photo currents using dot electrodes placed on selectively annealed and non annealed portions of deposited silicon layer 48. For the same optical power incident on the solar cell surface, the photo currents (arbitrary units) in the amorphous solar cell and the laser crystallized solar cell are compared in table 2. The laser crystallized cell showed high solar efficiency than the amorphous solar cell.

EXAMPLE 7

Figure 4:
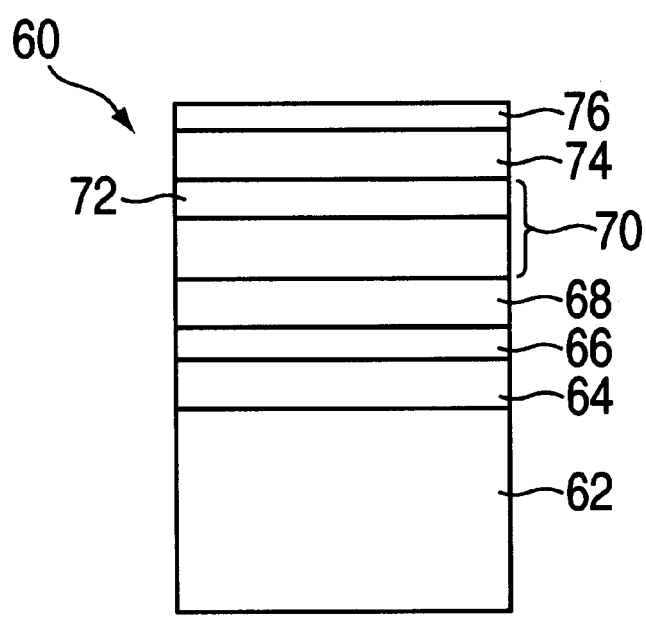
FIG. 4 is a sectional view of a photovoltaic cell constructed in accordance with example 7 of the present invention.

In this example of a photovoltaic cell 60, illustrated in FIG. 4, layers of conductive materials, doped silicon and undoped silicon were deposited on to a PEEK composite substrate 62 by the process described in example 4. The composition of substrate 62 consists of 40 weight % poly (etherether ketone) (PEEK)/60 weight % strontium titanate. Filled polymer substrate 62 showed good mechanical and electrical properties, including: a CTE of 35 ppm/° C. acceptable toughness and low moisture absorption (<0.2 wt %).

For solar cell applications, an electrically conductive film (metal or conductive oxide) is needed as one electrode. A structure consisting of a indium tin oxide layer 64 and a titanium film 66 of total thickness less than 4 microns and a selectively doped silicon layered film was used. The layered structure consists of a layer 68 of N-type silicon (doped $10^{17}/cm^3$ and 0.1 micron), a slightly P doped silicon layer 70 ($10^{14}/cm^3$ and 0.7 micron thickness). In the designed solar cell structure described, after deposition of layer 70, it's surface is annealed by laser (shown as 72) at energy 300 mJ/cm² and 10 Hz at 8–96 pulses at substrate temperatures in the range of 25–200° C. Thereafter a P-silicon layer 74 (p-type doping $10^{18}/cm^3$ and 0.05 microns) and a thin titanium film layer 76 (0.03 microns) were deposited.

EXAMPLE 8

Figure 5:
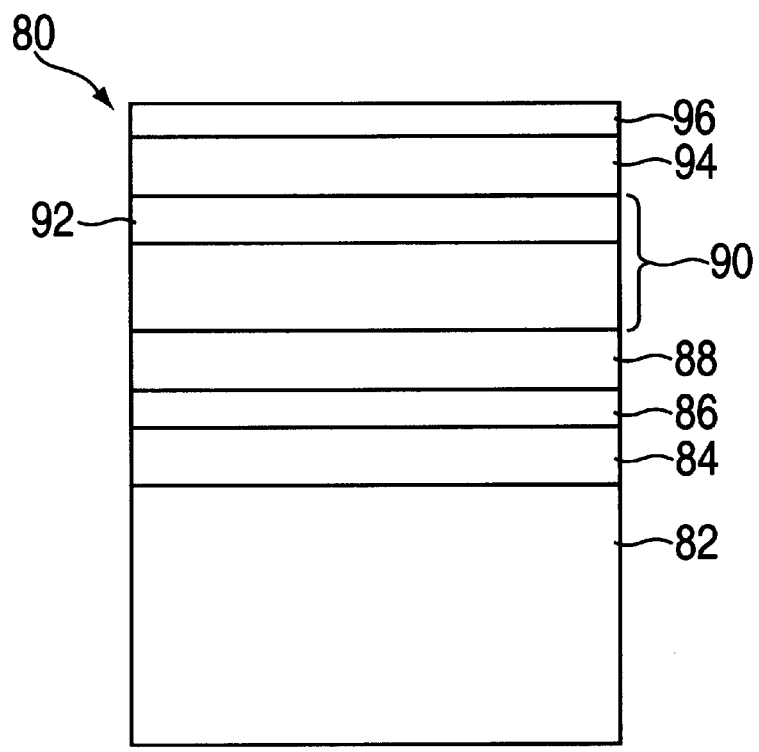
FIG. 5 is a sectional view of a photovoltaic cell constructed in accordance with example 8 of the present invention.

FIG. 5 shows another exemplary photovoltaic cell 80 comprised of layers of conductive materials, doped silicon and undoped silicon were deposited on a filled PPS substrate 82, produced by the process described in example 4, which was laminated with a copper layer 84 of 35 microns thickness. Copper layer 84 was corrugated with corrugation depth less than 2 micron. Substrate 82 consists of: (a) 62% volume % polyphenylene sulfide(PPS)/14% volume % SrTiO3/24 volume % Mica. The coefficient of thermal expansion (CTE) in the plane of the substrate surface was approximately 17 ppm/° C. Filled polymer substrate 82 showed good mechanical and electrical properties, including: acceptable toughness and low moisture absorption (<0.05 wt %) and good copper adhesion.

A structure consisting of a titanium film 86 (0.5 microns) on copper layer 84 and a selectively doped silicon layered film was considered. In the structure titanium film 86 is optional and can be replaced by another metal. The layered structure consists of a layer 88 of n-type silicon (doped $10^{17}$ and 0.2 micron) and an intrinsic silicon layer 90 (0.6 micron thickness). In the designed solar cell structure, after deposition of the intrinsic silicon layer 90, the surface 92 was annealed by laser at an energy of 300 mJ/cm² and 5 Hz at 8–96 pulses in the temperature range of 25–200° C. Thereafter a P-silicon layer 94 (P-type doping $10^{18}/cm^3$ and 0.05 microns) and titanium film electrode layer 96 (0.03 microns) were deposited. A titanium layer on the order of 0.03 microns is so thin as to be translucent. Alternatively the electrode could be formed by a transparent conductive material such as ITO. Solar cell in the laser annealed region showed higher photo current compared to the non laser annealed region.

EXAMPLE 9

Figure 6:
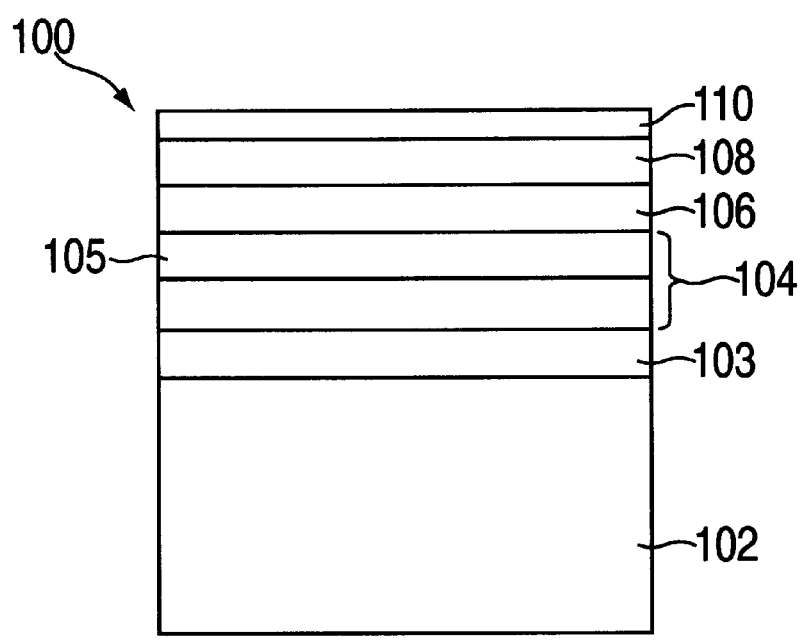
FIG. 6 is a sectional view of a light emitting diode constructed in accordance with example 9 of the present invention.

FIG. 6 illustrates a structure for a light emitting diode (LED) 100 formed on a filled substrate 102 which may be any of the various types discussed herein and which has a CTE of less than 40 ppm/° C. Deposited atop substrate 102 is an electrode 103 and a layer 104 of N type silicon (doped $10^{17}$–$10^{18}/cm^3$ and 0.1 to 0.3 micron thickness). The upper portion of layer 104 is laser annealed at energy >300 mJ/cm² and >5 Hz at 8–96 pulses, as shown by reference number 105, to a depth generally greater than 0.04 microns. There after a thin portion 106 of P type silicon doped $10^{16}$–$10^{18}/cm^3$ is deposited to a depth of less than 0.05 microns and is also laser annealed. Thereafter the entire structure may be subject to anodic etching in for example in an electrolyte mixture containing hydrofluoric acid, water and ethanol for band structure adjustment which will effect layers 105 and 106 as well as a portion of layer 104. Thereafter a layer 108 of P type silicon doped $10^{16}$–$10^{18}/cm^3$ to a thickness of 0.05 to 0.4 microns is deposited followed by an electrode layer 110 of any suitable, preferably translucent or transparent material. Alternatively, an LED may be formed with the N and P type layers reversed or with an intrinsic silicon or lightly doped N or P layer interposed therebetween.

TABLE 1

Sheet resistance of the N-type silicon layer with and without laser pulses

| Number of laser pulses | Sheet resistance ohms/sq |
|---|---|
| 0 | 50.8 |
| 8 | 40.9 |
| 16 | 37.4 |
| 32 | 31.5 |
| 64 | 28.7 |

TABLE 2

Solar cell photo current with and without laser pulses

| Number of laser pulses | Photo current (arbitrary units) |
|---|---|
| 0 | 0.13 |
| 8 | 0.15 |
| 16 | 0.18 |
| 32 | 0.16 |
| 64 | 0.26 |

The invention has been described with respect to preferred embodiments. However, as those skilled in the art will recognize, modifications and variations in the specific details which have been described and illustrated may be resorted to without departing from the spirit and scope of the invention as defined in the appended claims.

What is claimed is:

1. A structure for a semiconductor device comprising:
   a) a polymer substrate including a particulate filler for reducing the CTE of the polymer to less than 40 ppm/° C.;
   b) a first buffer layer disposed atop the substrate, said buffer layer having a thickness of less than 5 microns;
   c) at least one semiconductor layer disposed atop the first buffer layer, said semiconductor layer being at least partially laser annealed; and
   d) a second buffer layer disposed atop the at least one semiconductor layer said second buffer layer having a thickness of less than 2 microns.

2. The semiconductor device structure as claimed in claim 1 wherein the first buffer layer comprises a laminated metal.

3. The semiconductor device structure as claimed in claim 1 wherein the first buffer layer comprises at least one of a metal and a metal oxide.

4. The semiconductor device structure as claimed in claim 3 wherein the first and second buffer layers comprise materials selected from the group consisting of silicon dioxide, alumina, titanium oxide, tin oxide, indium tin oxide, indium oxide, tungsten oxide, magnesium oxide, niobium oxide, zirconium oxide, aluminum, titanium, copper, tantalum, chromium, cobalt, aluminum/copper, and mixtures thereof.

5. The semiconductor device structure as claimed in claim 1 wherein said polymer is selected from a group consisting of polyethylene, ultra-high molecular weight polyethylene, polystyrene, syndiotecticpolystyrene, poly(oxymethylene), polycarbonate, poly(phenyleneoxide), poly(etherimide), poly(sulfone), poly(ethersulfone), nylon 6, nylon 66, poly(ethylene terephthalate), poly(1,4-cyclohexanedimethylene terephthalate), poly(ethylene naphthalate), polyaralenesulfide, poly(phenylene sulfide), poly(amide imide), polyaralenetherketone, polyetheretherketone, poly(etherketone), cycloolefine copolymer, thermoplastic liquid crystalline polymers, fluoropolymer, thermoset, polyphenylene sulphone, and mixtures thereof.

6. The semiconductor device structure as claimed in claim 1 wherein the filler is selected from a group consisting of carbon, wollastonite, mica, talc, silicates, silica, clay, alumina, glass, rock wool, silicon carbide, diamond, fused quartz, aluminum nitride, beryllium oxide, boron nitride, and magnesium titanate, strontium titanate, calcium titanate, barium neodymium titanate, barium strontium titanate/magnesium zirconate, titanium oxide, barium titanate, barium magnesium titanate, lead zirconium titanate, barium zirconate, calcium zirconate, spinel, and thoria.

7. The semiconductor device structure as claimed in claim 1 further including at least two semiconductor layers forming a photovoltaic cell.

8. The semiconductor device structure as claimed in claim 1 further including at least two semiconductor layers forming a light emitting diode.

9. The semiconductor device structure as claimed in claim 1 wherein the CTE of the polymer is less than 30 ppm/° C.

10. The semiconductor device structure as claimed in claim 1 wherein the CTE of the polymer is less than 25 ppm/° C. in the plane of the substrate.

11. A structure for a photovoltaic device comprising:
   a) a polymer substrate including a particulate filler for reducing the CTE of the polymer to less than 30 ppm/° C.;
   b) a first electrode disposed atop the substrate;
   c) at least one semiconductor layer of a first polarity type deposited atop the first electrode,
   d) at least one semiconductor layer of a second polarity type deposited atop the first semiconductor layer,
   e) at least one of said semiconductor layers being at least partially laser annealed after deposition; and
   f) a second electrode disposed atop the second semiconductor layer.

12. The photovoltaic device structure as claimed in claim 11 further including a third semiconductor layer of a third polarity type.

13. The photovoltaic device structure as claimed in claim 11 wherein the first polarity type is N type.

14. The photovoltaic device structure as claimed in claim 11 wherein the first polarity type is P type.

15. The photovoltaic device structure as claimed in claim 11 wherein the third polarity type is neutral (intrinsic).

16. The photovoltaic device structure as claimed in claim 11 wherein the semiconductor layers comprise doped silicon.

17. The photovoltaic device structure as claimed in claim 11 wherein the CTE of the polymer is less than 25 ppm/° C. in the plane of the substrate.

* * * * *